US006246723B1

(12) United States Patent
Bliss et al.

(10) Patent No.: US 6,246,723 B1
(45) Date of Patent: Jun. 12, 2001

(54) SAMPLED AMPLITUDE READ CHANNEL EMPLOYING EARLY-DECISIONS FROM A TRELLIS SEQUENCE DETECTOR FOR SAMPLING VALUE ESTIMATION

(75) Inventors: William G. Bliss, Thornton; David E. Reed, Westminster; Marvin L. Vis, Longmont; German S. Feyh, Boulder, all of CO (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/072,285

(22) Filed: May 4, 1998

(51) Int. Cl.$^7$ ........................................... H04L 5/12
(52) U.S. Cl. ........................ 375/265; 375/341; 714/792
(58) Field of Search ..................... 375/341, 345, 375/265; 371/43; 714/786, 792, 794, 795

(56) References Cited

U.S. PATENT DOCUMENTS

| 5,291,499 | 3/1994 | Behrens et al. | 371/43 |
|---|---|---|---|
| 5,297,184 | 3/1994 | Behrens et al. | 375/98 |
| 5,359,631 | 10/1994 | Behrens et al. | 375/120 |
| 5,422,760 | 6/1995 | Abbott et al. | 360/46 |
| 5,585,975 | 12/1996 | Bliss | 360/65 |
| 5,642,243 | 6/1997 | Bliss | 360/51 |
| 5,696,639 | 12/1997 | Spurbeck et al. | 360/51 |
| 5,719,843 | 2/1998 | Nakajima et al. | 369/59 |
| 5,757,855 | 5/1998 | Strolle et al. | 375/262 |
| 5,822,143 | 10/1998 | Cloke et al. | 360/65 |
| 5,889,823 | * 3/1999 | Agazzi et al. | 375/341 |

OTHER PUBLICATIONS

Stephen B. Wicker, *Error Control Systems for Digital Communication and Storage*, Prentice Hall, 1995, pp. 290–332.

* cited by examiner

*Primary Examiner*—Don N. Vo
(74) *Attorney, Agent, or Firm*—Howard H. Sheerin; Dan A. Shifrin

(57) ABSTRACT

A sampled amplitude read channel is disclosed for disc storage systems that extracts early-decisions from a discrete-time trellis sequence detector to generate estimated target values for use in decision-directed timing recovery, gain control, and adaptive equalization. The trellis sequence detector comprises a metric generator for generating error metrics corresponding to a plurality of states of a state transition diagram, and a plurality of path memories which correspond to the paths of a trellis. The path memories store a plurality of survivor sequences which eventually merge into a most likely sequence at the output of the path memories. To reduce the latency in generating the estimated target samples, the trellis sequence detector outputs an early-decision from an intermediate location within the path memories. The early-decision is then converted into the partial response signaling space of the read signal samples. To improve the accuracy in estimating the target sample values, the accumulated metrics of a predetermined number of states are compared and the early-decision value is selected from the path memory having the smallest error metric. Alternatively, a majority-vote circuit evaluates the intermediate values stored in a predetermined number of the path memories and outputs the intermediate value that occurs most frequently. Although the early-decision technique of the present invention requires more latency than a simple slicer circuit, during acquisition the estimated target sample values are not used and therefore the increase in latency is not a significant problem.

20 Claims, 10 Drawing Sheets

SAMPLED AMPLITUDE READ CHANNEL EMPLOYING EARLY-DECISIONS FROM A TRELLIS SEQUENCE DETECTOR FOR SAMPLING VALUE ESTIMATION

CROSS REFERENCE TO RELATED APPLICATIONS AND PATENTS

This application is related to other co-pending U.S. patent applications, namely application Ser. Nos. 08/882,473 entitled "Asynchronous/Synchronous Gain Control for Interpolated Timing Recovery in a Sampled Amplitude Read Channel," and 08/640,351 entitled "Adaptive Equalization and Interpolated Timing Recovery in a Sampled Amplitude Read Channel for Magnetic Recording." This application is also related to several U.S. patents, namely U.S. Pat. No. 5,359,631 entitled "Timing Recovery Circuit for Synchronous Waveform Sampling," 5,696,639 entitled "Sampled Amplitude Read Channel Employing Interpolated Timing Recovery," 5,291,499 entitled "Method and Apparatus for Reduced-Complexity Viterbi-Type Sequence Detectors," 5,297,184 entitled "Gain Control Circuit for Synchronous Waveform Sampling," 5,329,554 entitled "Digital Pulse Detector," 5,576,904 entitled "Timing Gradient Smoothing Circuit in a Synchronous Read Channel," 5,585,975 entitled "Equalization for Sample Value Estimation and Sequence Detection in a Sampled Amplitude Read Channel," 5,424,881 entitled 5,771,127 entitled "A Sampled Amplitude Read Channel Employing Interpolated Timing Recovery and a Remod/Demod Sequence Detector," and 5,754,352 entitled "A Synchronous Read Channel Employing an Expected Sample Value Generator for Acquiring a Preamble." All of the above-named patent applications and patents are assigned to the same entity, and all are incorporated herein by reference.

FIELD OF INVENTION

The present invention relates to the control of storage systems for digital computers (such as magnetic and optical disc drives), particularly to a sampled amplitude read channel that uses early-decisions from a trellis sequence detector to generate estimated sample values for gain control, timing recovery, and equalization.

BACKGROUND OF THE INVENTION

Computer storage systems (such as optical, magnetic, and the like) record digital data onto the surface of a storage medium, which is typically in the form of a rotating magnetic or optical disk, by altering a surface characteristic of the disk. The digital data serves to modulate the operation of a write transducer (write head) which records binary sequences onto the disc in radially concentric or spiral tracks. In magnetic recording systems, for example, the digital data modulates the current in a write coil in order to record a series of magnetic flux transitions onto the surface of a magnetizable disk. And in optical recording systems, the digital data may modulate the intensity of a laser beam in order to record a series of "pits" onto the surface of an optical disk. When reading this recorded data, a read transducer (read head) positioned in close proximity to the rotating disc detects the alterations on the medium and generates a sequence of corresponding pulses in an analog read signal. These pulses are then detected and decoded by read channel circuitry in order to reproduce the digital sequence.

Detecting and decoding the pulses into a digital sequence can be performed by a simple peak detector in a conventional analog read channel or, as in more recent designs, by a discrete-time sequence detector in a sampled amplitude read channel. Discrete-time sequence detectors are preferred over simple analog pulse detectors because they compensate for intersymbol interference (ISI) and are less susceptible to channel noise. Consequently, discrete-time sequence detectors increase the capacity and reliability of the storage system.

There are several well known discrete-time sequence detection methods including discrete-time pulse detection (DPD), partial response (PR) with Viterbi detection, maximum likelihood sequence detection (MLSD), decision-feedback equalization (DFE), enhanced decision-feedback equalization (EDFE), and fixed-delay tree-search with decision-feedback (FDTS/DF).

Unlike conventional peak detection systems, sampled amplitude recording detects digital data by interpreting, at discrete-time instances, the actual value of the pulse data. To this end, the read channel comprises a sampling device for sampling the analog read signal, and a timing recovery circuit for synchronizing the samples to the baud rate (code bit rate). Before sampling the pulses, a variable gain amplifier adjusts the read signal's amplitude to a nominal value, and a low pass analog filter filters the read signal to attenuate channel and aliasing noise. After sampling, a discrete-time equalizer equalizes the sample values according to a desired partial response, and a discrete-time sequence detector, such as a Viterbi detector, interprets the equalized sample values in context to determine a most likely sequence for the digital data (i.e., maximum likelihood sequence detection (MLSD)). MLSD takes into account the effect of ISI and channel noise in the detection algorithm, thereby decreasing the probability of a detection error. This increases the effective signal to noise ratio and, for a given RLL (d,k) constraint, allows for significantly higher data density as compared to conventional analog peak detection read channels.

The application of sampled amplitude techniques to digital communication channels is well documented. See Y. Kabal and S. Pasupathy, "Partial Response Signaling", *IEEE Trans. Commun. Tech.*, Vol. COM-23, pp.921–934, September 1975; and Edward A. Lee and David G. Messerschmitt, "Digital Communication", Kluwer Academic Publishers, Boston, 1990; and G. D. Forney, Jr., "The Viterbi Algorithm", *Proc. IEEE,* Vol. 61, pp. 268–278, March 1973.

Applying sampled amplitude techniques to magnetic storage systems is also well documented. See Roy D. Cideciyan, Francois Dolivo, Walter Hirt, and Wolfgang Schott, "A PRML System for Digital Magnetic Recording", *IEEE Journal on Selected Areas in Communications,* Vol. 10 No. 1, January 1992, pp.38–56; and Wood et al, "Viterbi Detection of Class IV Partial Response on a Magnetic Recording Channel", *IEEE Trans. Commun.,* Vol. Com-34, No. 5, pp. 454–461, May 1986; and Coker Et al, "Implementation of PRML in a Rigid Disc Drive", *IEEE Trans. on Magnetics,* Vol. 27, No. 6, Nov. 1991; and Carley et al, "Adaptive Continous-Time Equalization Followed By FDTS/DF Sequence Detection", *Digest of The Magnetic Recording Conference,* Aug. 15–17, 1994, pp. C3; and Moon et al, "Constrained-Complexity Equalizer Design for Fixed Delay Tree Search with Decision Feedback", *IEEE Trans. on Magnetics,* Vol. 30, No. 5, September 1994; and Abbott et al, "Timing Recovery For Adaptive Decision Feedback Equalization of The Magnetic Storage Channel", *Globecom'90 IEEE Global Telecommunications Conference* 1990, San Diego, Calif., November 1990, pp.1794–1799; and Abbott et al, "Performance of Digital Magnetic Recording with Equalization and Offtrack Interference", *IEEE Transactions on Magnetics,* Vol. 27, No. 1, January 1991; and Cioffi et al, "Adaptive Equalization in Magnetic-Disc Storage Channels", *IEEE Communication Magazine,* February 1990; and Roger Wood, "Enhanced Decision Feedback Equalization", *Intermag'90.*

The timing recovery circuit for synchronizing the read signal samples to the baud rate is a decision-directed phase-locked-loop (PLL). It computes a phase error between the read signal samples and the ideal or target partial response samples which is used to adjust the PLL until the read signal samples are synchronized. Conventionally, the phase error adjusts the output of variable frequency oscillator (VFO). The output of the VFO is a sampling clock for controlling an analog-to-digital converter (ADC) which samples the read signal synchronous to the baud rate. Alternatively, the read signal can be sampled asynchronously and the asynchronous sample values interpolated to generate the baud rate synchronous sample values. For details concerning this method of timing recovery, see the above referenced U.S. patent entitled "Sampled Amplitude Read Channel Employing Interpolated Timing Recovery."

The phase error is computed the same for both synchronous sampling and interpolated timing recovery. Conventionally, the target sample values for computing the phase error are generated by a slicer circuit. The slicer circuit generates an estimated target sample value by selecting the target sample closest to the current read signal sample. This can be implemented simply by comparing the read signal sample to a number of thresholds which correspond to the possible target samples of the partial response signaling space. For example, in the partial response class-IV signaling space, the target samples are +1, 0 and −1. Therefore, the slicer is implemented using a positive and negative threshold: if the read signal sample value is above the positive threshold the slicer outputs a +1, if the read signal sample value is below the negative threshold the slicer outputs a −1, otherwise the slicer outputs a 0. The advantage of using a simple slicer circuit to generate the estimated target sample value is its inherent low latency, particularly when acquiring the acquisition preamble (described below) where the loop bandwidth is set as high as possible in order to minimize the time (and bits) needed to acquire the preamble.

Similar to the timing recovery circuit, the gain control circuit for adjusting the gain of the read signal at the output of the VGA is also a decision-directed feed back system. A gain error is computed from the equalized sample values and estimated target sample values. The gain error is converted into an analog control signal which controls the gain of the VGA. Again, the latency of the gain loop impacts the overall performance of the read channel, therefore conventional read channels employ a slicer circuit for generating the estimated target samples for use in computing the gain error.

The discrete-time equalizer filter for equalizing the read signal sample values according to the desired partial response may be adaptively adjusted in real-time using a decision-directed feed back system. Similar to timing recovery and gain control, an adaptive equalizer computes an error value from the equalized sample values and estimated target sample values; the error value is then used to update the filter's coefficients. For example, the coefficients may be updated according to the well known least mean square (LMS) algorithm:

$$W_{k+1}=W_k-\mu \cdot e_k \cdot X_k,$$

where $W_k$ represents a vector of filter coefficients, $\mu$ is a programmable gain, $e_k$ represents a sample error between the filter's actual output and a desired output, and $X_k$ represents a vector of sample values from the filter input. In other words, the LMS adaptive equalizer filter is a closed loop feedback system that attempts to minimize the mean squared error between an actual output of the filter and a desired output by continuously adjusting the filter's coefficients to achieve an optimum frequency response. The latency of this loop impacts the overall performance of the read channel; conventional read channels employ a slicer circuit to generate the estimated target samples in order to minimize this latency.

Another performance measurement of disc storage systems is the overall storage capacity which is continuously pushed higher by increasing the tracks per inch (TPI) and/or by increasing the linear bit density in the data sectors. However, when the linear bit density increases beyond a certain threshold, the accuracy of a simple slicer circuit degrades due to the increase in intersymbol interference. This degradation in the slicer error rate eventually has a significant adverse impact on the performance of gain control, timing recovery, and the adaptive equalizer-the decision-directed feedback loops are less effective if the decisions about the estimated targets samples are incorrect. This loss in performance propagates through to the discrete-time sequence detector, thereby increasing the bit error rate in the detected user data sequence. The increased number of bit errors can be corrected by employing more ECC redundancy symbols, but this is undesirable because it reduces the amount of recordable area for user data and it increases the cost and complexity of the ECC circuitry.

There is, therefore, a need for a more accurate technique to generate estimated target sample values for use in the decision-directed feed back loops of a sampled amplitude read channel. In particular, there is a need to generate accurate estimated target samples when the linear bit density increases to a level that renders a simple slicer circuit impracticable. Another object of the present invention is to avoid using estimated sample values altogether while acquiring the acquisition preamble, thereby obviating the latency problem inherent in prior art read channels.

SUMMARY OF THE INVENTION

A sampled amplitude read channel is disclosed for disc storage systems that extracts early-decisions from a discrete-time trellis sequence detector to generate estimated target values for use in decision-directed timing recovery, gain control, and adaptive equalization. The trellis sequence detector comprises a metric generator for generating error metrics corresponding to a plurality of states of a state transition diagram, and a plurality of path memories which correspond to the paths of a trellis. The path memories store a plurality of survivor sequences which eventually merge into a most likely sequence at the output of the path memories. To reduce the latency in generating the estimated target samples, the trellis sequence detector outputs an early-decision from an intermediate location within the path memories. The early-decision is then converted into the partial response signaling space of the read signal samples. To improve the accuracy in estimating the target sample values, the accumulated metrics of a predetermined number of states are compared and the early-decision value is selected from the path memory having the smallest error metric. Alternatively, a majority-vote circuit evaluates the intermediate values stored in a predetermined number of the path memories and outputs the intermediate value that occurs most frequently. Although the early-decision technique of the present invention requires more latency than a simple slicer circuit, during acquisition the estimated target sample values are not used and therefore the increase in latency is not a significant problem.

BRIEF DESCRIPTION OF THE DRAWINGS

The above and other aspects and advantages of the present invention will be better understood by reading the following detailed description of the invention in conjunction with the drawings, wherein.

DETAILED DESCRIPTION OF THE PREFERRED EMBODIMENT

Data Format

Figure 1A:
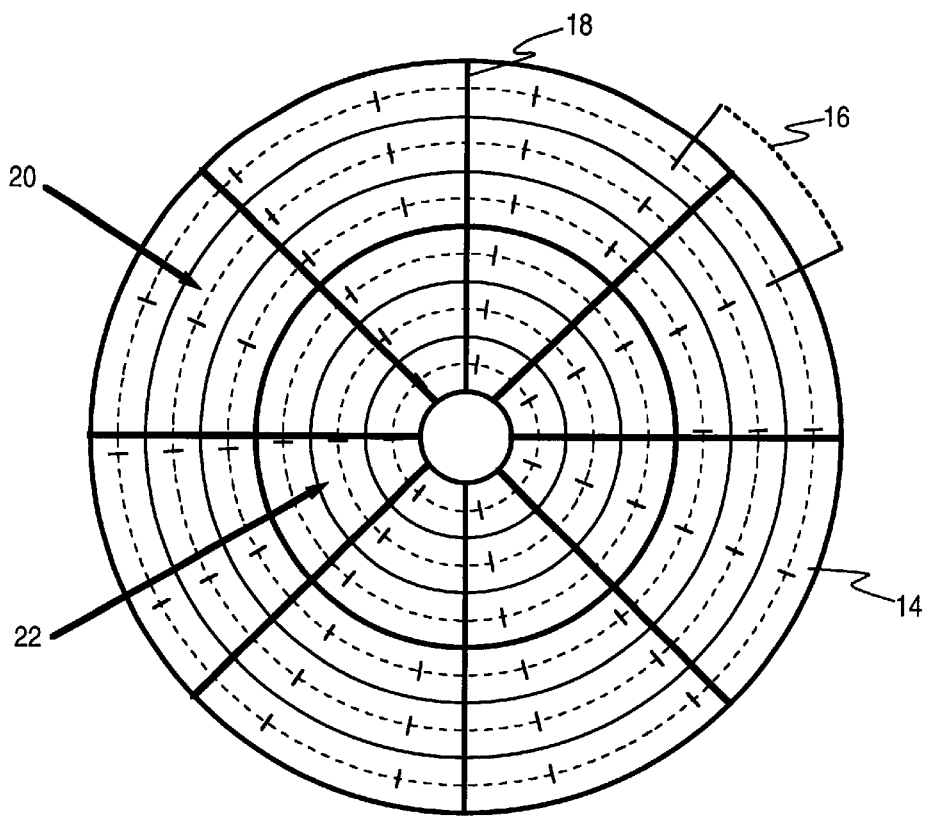
FIG. 1A shows a magnetic disc storage medium comprising a plurality of concentric data tracks and embedded servo wedges, where the data tracks are partitioned into a plurality of data sectors.

FIG. 1A shows a conventional data format of a magnetic disc storage medium comprising a series of concentric, radially spaced data tracks 14, wherein each data track 14 comprises a plurality of sectors 16 with embedded servo wedges 18. A servo controller (not shown) processes the servo data in the servo wedges 18 and, in response thereto, positions a read/write head over a selected track. Additionally, the servo controller processes servo bursts within the servo wedges 18 to keep the head aligned over a centerline of the selected track while writing and reading data. The servo wedges 18 may be detected by a simple discrete-time pulse detector or by the discrete-time sequence detector of FIG. 2. The format of the servo wedges 18 includes a preamble and a sync mark, similar to the user data sectors 16 described below with reference to FIG. 1B.

Figure 1B:
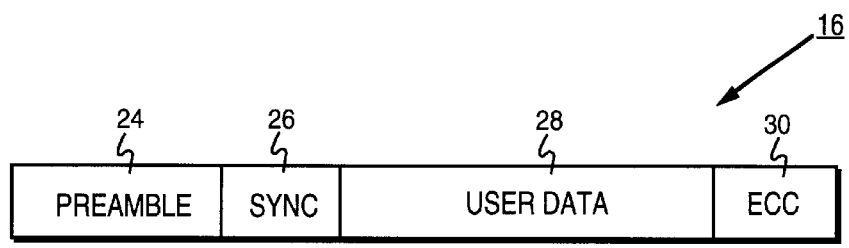
FIG. 1B shows an example format of a data sector comprising a preamble for frequency/phase locking timing recovery, a sync mark for symbol synchronizing the user data, and redundancy symbols of an error correction code (ECC).

FIG. 1B shows the format of a conventional data sector 16 comprised of an acquisition preamble 24, a sync mark 26, and a data field 28 including appended ECC bytes 30 for use in detecting and correcting errors in the user data 28 upon readback. Timing recovery 68 of FIG. 2 processes the acquisition preamble 24 to acquire the correct data frequency and phase before reading the user data field 28, and the sync mark 26 demarks the beginning of the user data field 28 for use in symbol synchronizing the user data 28.

Zoned recording is a technique known in the art for increasing the storage density by recording the user data at different rates in predefined zones between the inner diameter and outer diameter tracks. The data rate can be increased at the outer diameter tracks due to the increase in circumferential recording area and the decrease in intersymbol interference. This allows more data to be stored in the outer diameter tracks as is illustrated in FIG. 1A where the disc is partitioned into an outer zone 20 comprising fourteen data sectors per track, and an inner zone 22 comprising seven data sectors per track. In practice, the disc may actually be partitioned into several zones at varying data rates.

Sampled Amplitude Read Channel

Figure 2:
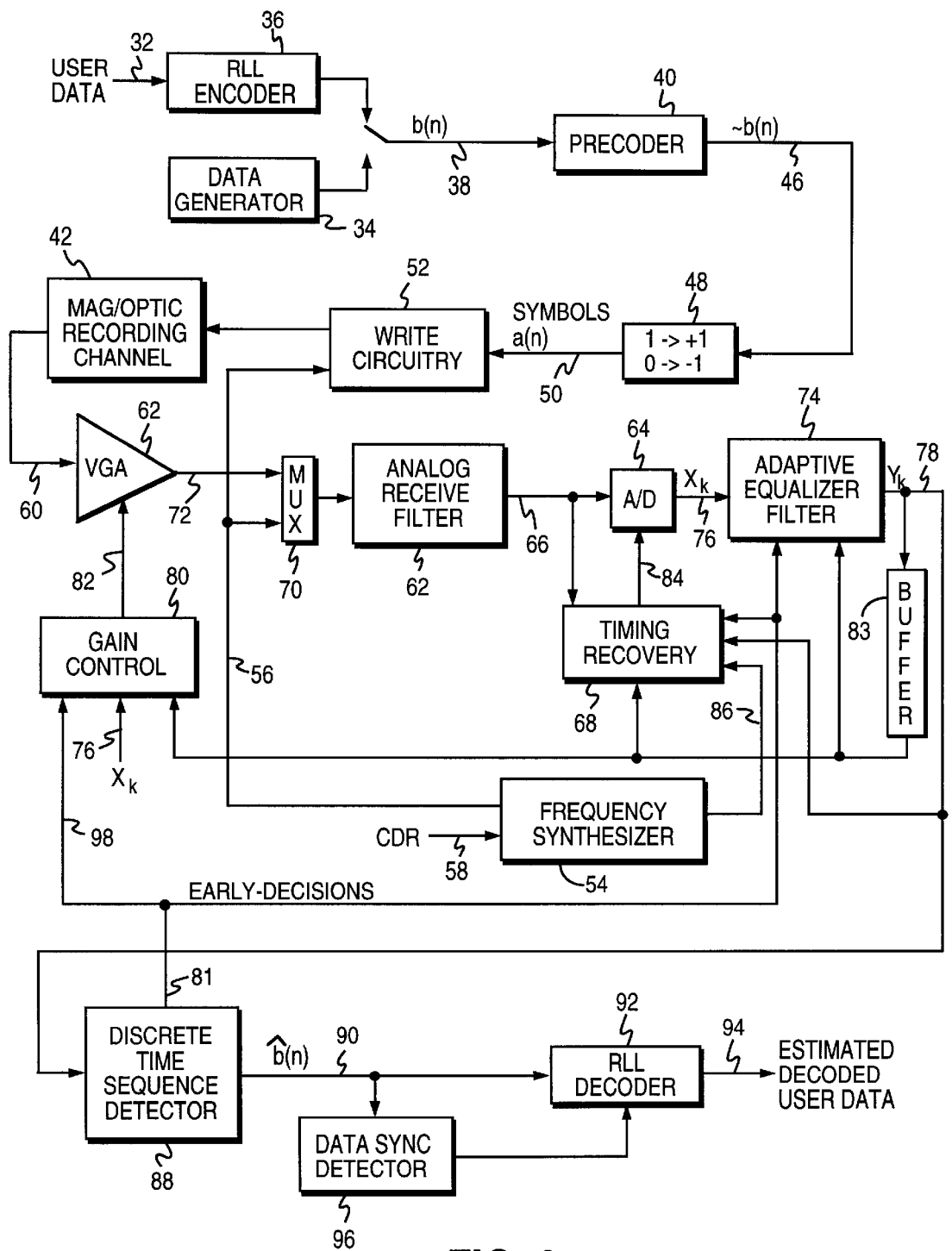
FIG. 2 is a block diagram of a sampled amplitude read channel employing an early-decision output from a trellis sequence detector according to aspects of the present invention.

Referring now to FIG. 2, shown is a block diagram of the sampled amplitude read channel of the present invention. During a write operation, the read channel receives user data over line 32 from the host system. A data generator 34 generates the preamble 24 of FIG. 1B (for example 2T preamble data) which is written to the disc prior to writing the user data 28. The data generator 34 also generates a sync mark 26 for use in symbol synchronizing to the user data during a read operation. An RLL encoder 36 encodes the user data according to a run-length limited RLL (d,k) constraint to generate an encoded binary sequence b(n) 38. The RLL d constraint attenuates intersymbol interference by specifying a minimum spacing that must occur between consecutive transitions on the storage medium (i.e., a minimum number of "0" bits that must occur between consecutive "1" bits). The RLL constraint specifies the maximum spacing between consecutive transitions (maximum number of consecutive "0" bits) which must be constrained in order to enable operation of the gain control 80 and timing recovery 68 circuits.

A precoder 40 precodes the binary sequence b(n) 38 in order to compensate for the transfer function of the recording channel 42 and equalizing filters. The bits of the precoded sequence ~b(n) 46 are converted into symbols a(n) 50 by translating 48 b(N)=0 into a(N)=−1, and ~b(N)=1 into a(N)=+1 (the symbols ~b(n) 46 are referred to as NRZ data). Write circuitry 52, responsive to the symbols a(n) 50, modulates the current in the recording head coil (or intensity of a laser beam) at the zone baud rate to record a sequence of transitions onto the disc 42, wherein the transitions represent the recorded data. A frequency synthesizer 54 provides a baud rate write clock 56 to the write circuitry 52 and is adjusted by a baud or channel data rate signal (CDR) 58 according to the current zone the recording head is over.

When reading the recorded binary sequence from the disc, timing recovery 68 first locks to the write frequency by selecting, as the input to the read channel, the write clock 56 through a multiplexer 70. Once locked to the write frequency, the multiplexer 70 selects the signal 72 from the read head as the input to the read channel in order to acquire the acquisition preamble 24 recorded on the disc prior to the recorded user data 28 as shown in FIG. 1B. A variable gain amplifier 62 adjusts the amplitude of the analog read signal 60, and an analog receive filter 62 provides initial equalization toward the desired response as well as attenuating aliasing noise. A sampling device 64 samples the analog read signal 66 from the analog filter 62, and a discrete-time equalizer filter 74 provides further equalization of the sample values 76 toward the desired response. In partial response recording, for example, the desired partial response is often selected from Table 1:

TABLE 1

| Channel | Transfer Function | Dipulse Response |
|---------|-------------------|------------------|
| PR4 | (1 − D) (1 + D) | 0, 1, 0, −1, 0, 0, 0, . . . |
| EPR4 | (1 − D) (1 + D)$^2$ | 0, 1, 1, −1, −1, 0, 0, . . . |
| EEPR4 | (1 − D) (1 + D)$^3$ | 0, 1, 2, 0, −2, −1, 0, . . . |

The discrete equalizer filter 74 may be implemented as a real-time adaptive filter which compensates for parameter variations over the disc radius (i.e., zones), disc angle, and environmental conditions such as temperature drift.

After equalization, the equalized sample values 78 are applied to a decision directed gain control 80 and timing recovery 68 circuit for adjusting the amplitude of the read signal 60 and the frequency and phase of the sampling device 64, respectively. Gain control 80 adjusts the gain of variable gain amplifier 62 over line 82 in order to match the magnitude of the channel's frequency response to the desired partial response, and timing recovery 68 adjusts the frequency of sampling device 64 over line 84 in order to synchronize the equalized samples 78 to the baud rate. Frequency synthesizer 54 provides a course center frequency setting to the timing recovery circuit 68 over line 86 in order to center the timing recovery frequency over temperature, voltage, and process variations.

The synchronous, equalized samples 78 are ultimately input into a discrete-time trellis sequence detector 88 which detects an estimated binary sequence ^b(n) 90 from the sample values. An RLL decoder 92 decodes the estimated binary sequence b(n) 90 from the sequence detector 88 into estimated user data 94. A data sync detector 96 detects the sync mark 26 (shown in FIG. 1B) in the data sector 16 in order to frame operation of the RLL decoder 92. In the absence of errors, the estimated binary sequence ^b(n) 90 matches the recorded binary sequence b(n) 38, and the decoded user data 94 matches the recorded user data 32.

In the present invention, the trellis sequence detector 88 also generates the estimated target samples 81 for use in the decision-directed feedback loops of gain control 80, timing recovery 68, and the adaptive equalizer 74. As explained in greater detail below, the estimated target samples 81 are generated by extracting "early-decisions" from the path memories that represent the trellis of the sequence detector 88. Using early-decisions, as opposed to using the output 90 of the sequence detector 88, reduces the latency in computing the estimated target samples 81. Although using early-decisions from the sequence detector 88 introduces more latency than a simple slicer circuit, the adverse effect is alleviated by avoiding the use of estimated target samples during acquisition. Also, because of the delay in generating the estimated target samples 81, the equalized samples 78 are buffered 83 in order to correctly align the equalized samples 78 with the appropriate target samples 81 when computing the error values for the feedback loops.

Trellis Sequence Detector

The sampled amplitude read channel of the present invention employs partial response (PR) equalization and maximum likelihood (ML) sequence detection (e.g., Viterbi sequence detection). To understand the sequence detection operation, consider the trellis sequence detector for a partial response class-IV (PR4) read channel. The transfer function for this channel is represented by the polynomial (1−D$^2$) where D is a delay operator referring to the channel or baud rate. With the input symbols a(n) taking on the at values +1 or −1, the output channel samples take on values in the set {+2, 0, −2}. A trellis sequence detector, such as a Viterbi detector for PR4, operates by examining the channel samples in context to determine a most likely estimated data sequence associated with the samples.

Figure 3A:
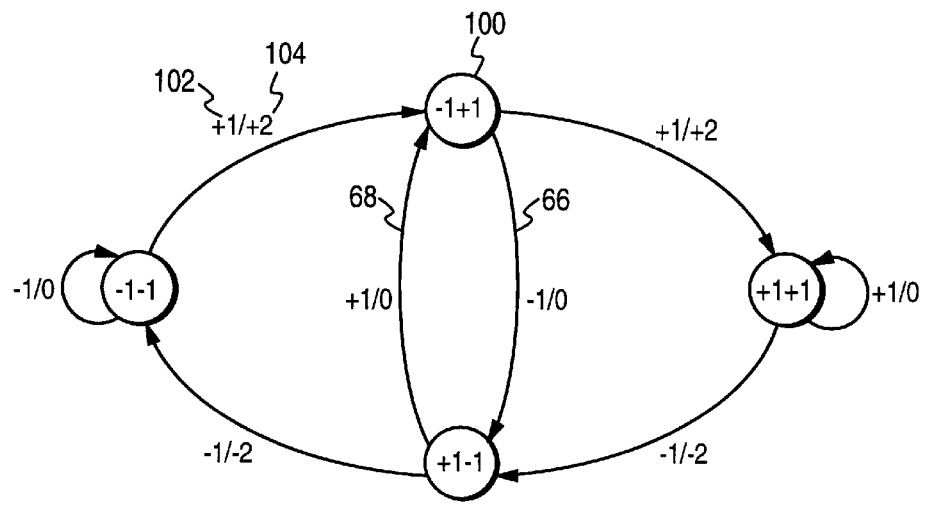
FIG. 3A is a state transition diagram of a conventional Partial Response class-IV (PR4) Viterbi sequence detector.

Operation of the PR4 sequence detector is understood from its state transition diagram shown in FIG. 3A. Each state 100 is represented by the last two input symbols a(n) 102 (after precoding), and each branch from one state to another is labeled with the current input symbol a(n) 102 and the corresponding sample value 104 it will produce during readback. Thus, during readback the sample sequence can be demodulated into the input symbol sequence a(n) (recorded sequence) according to the state transition diagram. However, noise in the read signal due to timing errors, miss-equalization, etc., will obfuscate the readback sample values and introduce ambiguity in the correct demodulated data sequence. The function of the sequence detector, then, is to resolve this ambiguity by demodulating the sample values into a most likely data sequence.

Figure 3B:
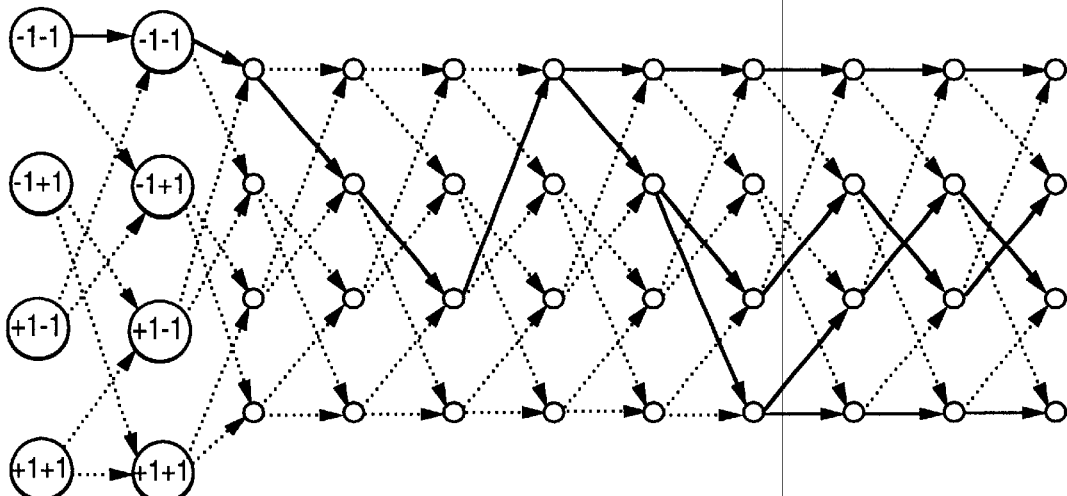
FIG. 3B is a PR4 trellis diagram corresponding to the PR4 state transition diagram of FIG. 3A.

The demodulation process of the sequence detector is understood by representing the state transition diagram of FIG. 3A as a trellis diagram shown in FIG. 3B. The trellis diagram represents a time sequence of sample values and the possible recorded input sequences a(n) that could have produced the sample sequence. For each possible input sequence a(n), an error metric is computed relative to a difference between the sequence of expected sample values that would have been generated in a noiseless system and the actual sample values read from the channel. For instance, a Euclidean metric is computed as the accumulated square difference between the expected and actual sample values. The input sequence a(n) that generates the smallest Euclidean metric is the most likely sequence to have created the actual sample values; this sequence is therefore selected as the output of the sequence detector.

To facilitate the demodulation process, the sequence detector comprises path memories for storing each of the possible input sequences a(n) and a corresponding metric. A well known property of the sequence detector is that the paths storing the possible input sequences will "merge" into a most likely input sequence after a certain number of sample values are processed (as long as the input sequence is appropriately constrained). In fact, the maximum number of path memories needed equals the number of states in the trellis diagram; the most likely input sequence will always be represented by one of these paths, and these paths will eventually merge into one path (i.e., the most likely input sequence) after a certain number of sample values are processed.

The "merging" of path memories is understood from the trellis diagram of FIG. 3B where the "survivor" sequences are represented as solid lines. Notice that each state in the trellis diagram can be reached from one of two states; that is, there are two transition branches leading to each state. With each new sample value, the Viterbi algorithm recursively computes a new error metric and retains a single survivor sequence for each state corresponding to the minimum accumulated error metric. In other words, the Viterbi algorithm will select one of the two input branches into each state since only one of the branches will correspond to the minimum accumulated error metric. As a result, the paths through the trellis corresponding to the branches not selected will merge into the paths that were selected. Eventually, all of the survivor sequences will merge into one path through the trellis which represents the most likely estimated data sequence to have generated the sample values as shown in FIG. 3B.

Figure 4:
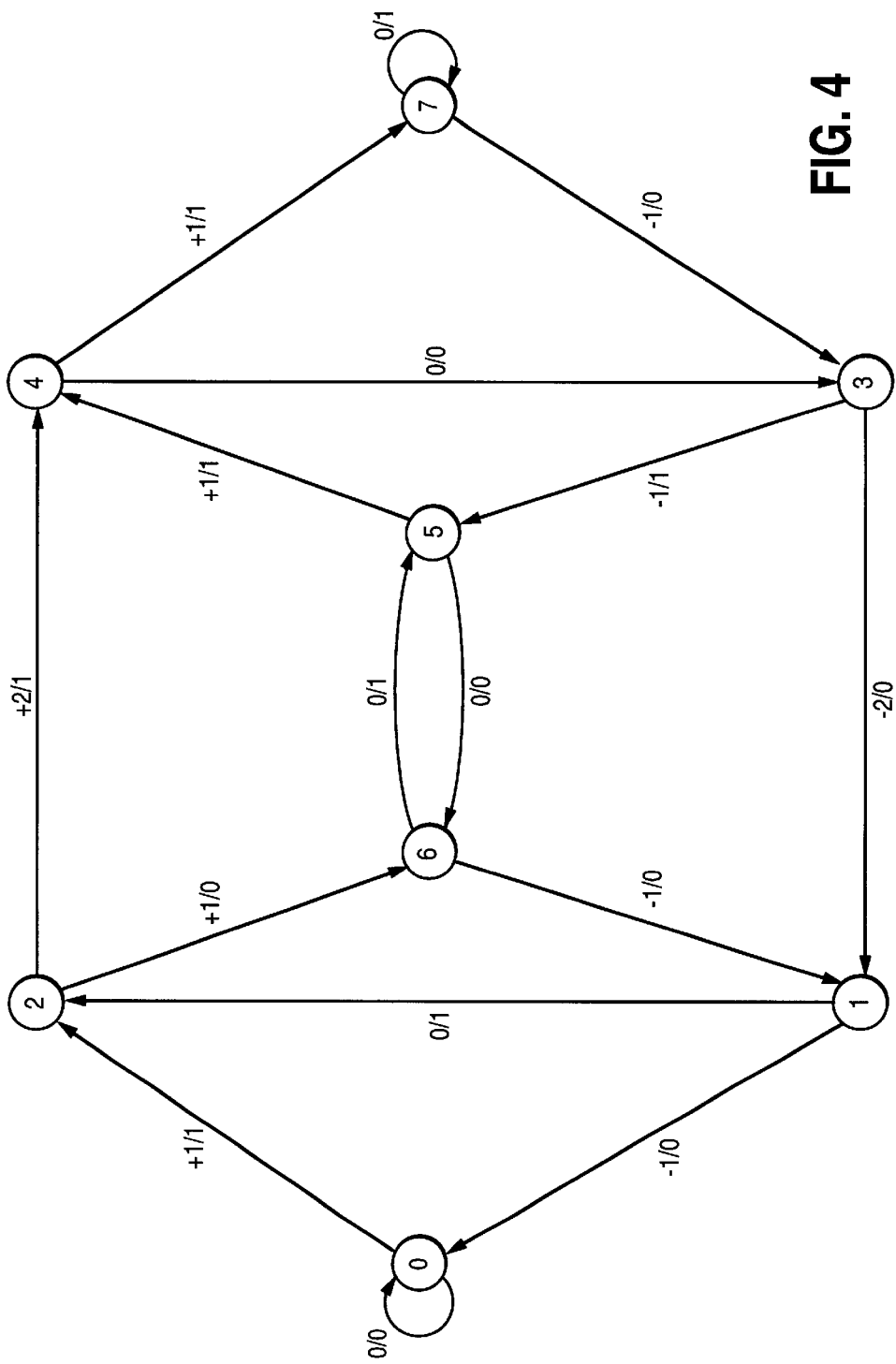
FIG. 4 shows the state transition diagram for an EPR4 trellis sequence detector which is the preferred embodiment of the present invention.

The state transition diagrams and corresponding trellis diagrams vary depending on the type of partial response signaling employed. In the present invention, the preferred partial response signaling is EPR4 which has a dipulse response of $$0, 1, 1, -1, -1, 0, 0, \ldots$$

as shown in Table 1 above. The state transition diagram for an EPR4 sequence detector is shown in FIG. 4; there are $2^3$ or eight states which represent the eight possible patterns of intersymbol interference that can result when time shifted versions of the dipulse response are added together.

Details of the circuitry employed to implement the EPR4 trellis sequence detector of the present invention are shown in FIG. 5. The equalized samples 78 are processed by a 104 which generates a branch error metric for each of the two branches entering the states in the trellis. In the preferred embodiment, the error metric is computed in Euclidean space as the squared difference between the equalized sample value and the ideal EPR4 sample values. The 16 branch error metrics 106 (two for each of the eight states) are processed by a branch selector 110 which selects the branch into each of the eight states that has the smallest accumulated error metric. For each branch selected, a corresponding estimated data bit (in NRZ) is loaded into the eight path memories $35_0$–$35_7$. The path memories $35_0$–$35_7$ comprise an input memory element, an output memory element, and a plurality of intermediate memory elements that are connected to operate like a shift register.

Figure 5A:
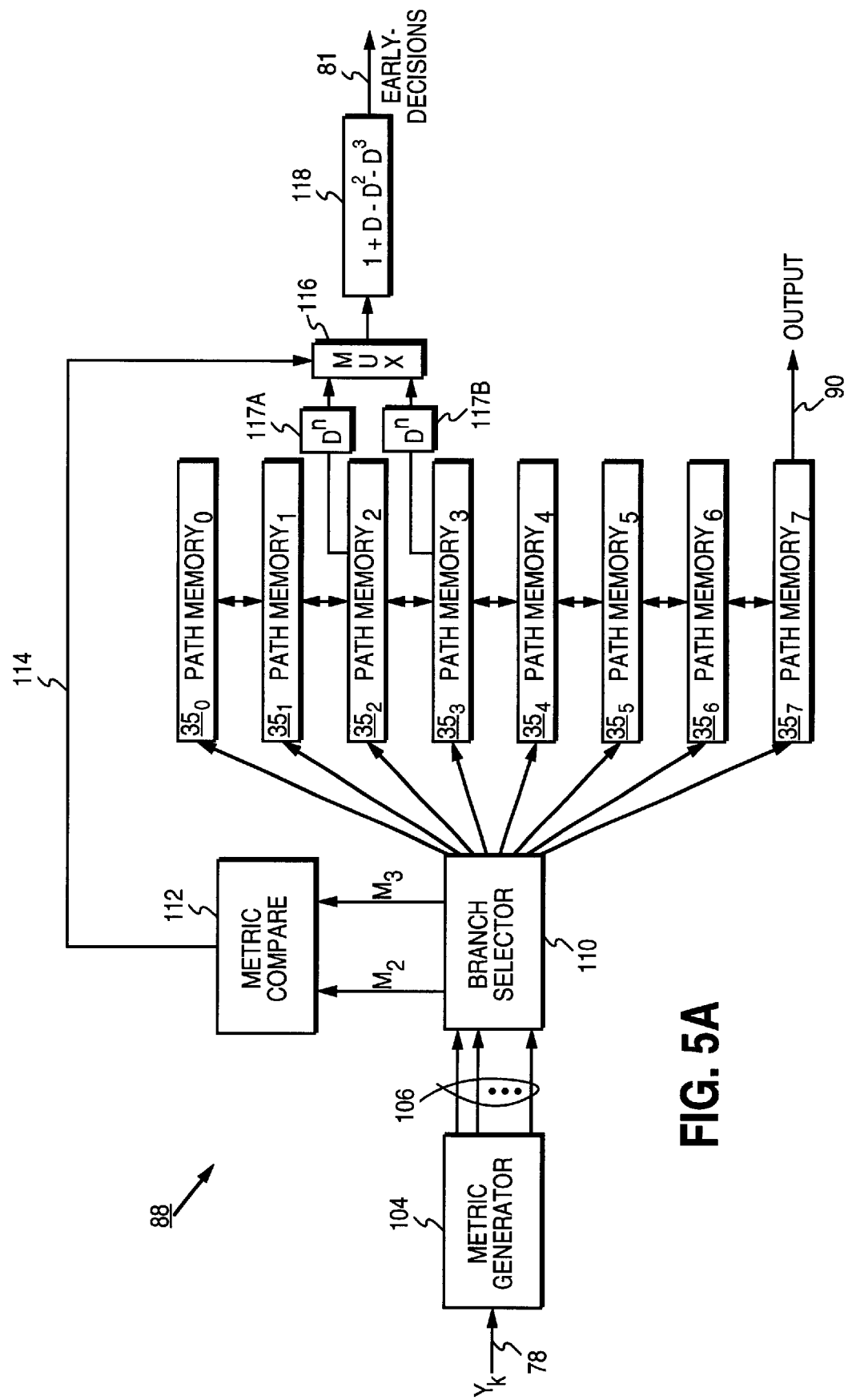
FIG. 5A shows implementation details of the EPR4 trellis sequence detector of FIG. 4, including a metric compare circuit for selecting the most likely early-decision for the estimated target sample.

The branch selector 110 merges the sequences stored in the path memories $35_0$–$35_7$ which correspond to the branches not selected. Eventually, all of the sequences stored in the path memories $35_0$–$35_7$ will merge into a single most likely sequence which is selected as the output 90 of the trellis sequence detector 88. In FIG. 5A, the output 90 of the trellis sequence detector 88 is selected as the output of the last path memory $35_7$; however, the output could be selected from any of the path memories since they all store the same merged survivor sequence. As explained above, the path memories are designed to be long enough to guarantee that the paths merge into a single survivor sequence, but also as short as possible to minimize the latency and circuitry cost.

Early-Decisions

The present invention exploits the performance gain provided by the trellis sequence detector 88 to generate more accurate estimated target samples for use in the decision-directed feedback loops of gain control 80, timing recovery 68, and the adaptive equalizer 74. Thus, at higher linear bit densities the estimated target samples can be generated with much higher accuracy as compared to using a conventional slicer circuit. It is possible to exploit all of the performance gain provided by the trellis sequence detector 88 by using the output 90 of the detector 88 to generate the estimated target samples. However, this would introduce a significant amount of latency into the feedback loops due to the propagation delay inherent in the path memories which represent the paths of the trellis. In other words, there is a significant delay in waiting for all of the paths of the trellis to merge into a single most likely survivor sequence as shown in FIG. 3B. Thus, the amount of latency would equal the length of the path memories in the trellis sequence detector 88; it would most likely be too long to be practical.

To reduce the latency in generating the estimated target sample values, the present invention extracts "early-decisions" from the path memories of the trellis sequence detector 88. In one embodiment, the output is simply selected from a predetermined intermediate memory element of a selected path memory. This embodiment requires no further computational delay, but it has the highest error rate since the path selected may not have merged into the most likely sequence. To improve the performance, the error metrics from a subset of path memories are evaluated and the path memory with the smallest accumulated error metric is selected as the output for the early-decision. This embodiment is illustrated in FIG. 5A where the conventional EPR4 trellis sequence detector has been modified to further comprise a metric compare circuit 112 for comparing the accumulated error metrics for a subset of the path memories (i.e., a subset of the states in FIG. 4).

Figure 9A:
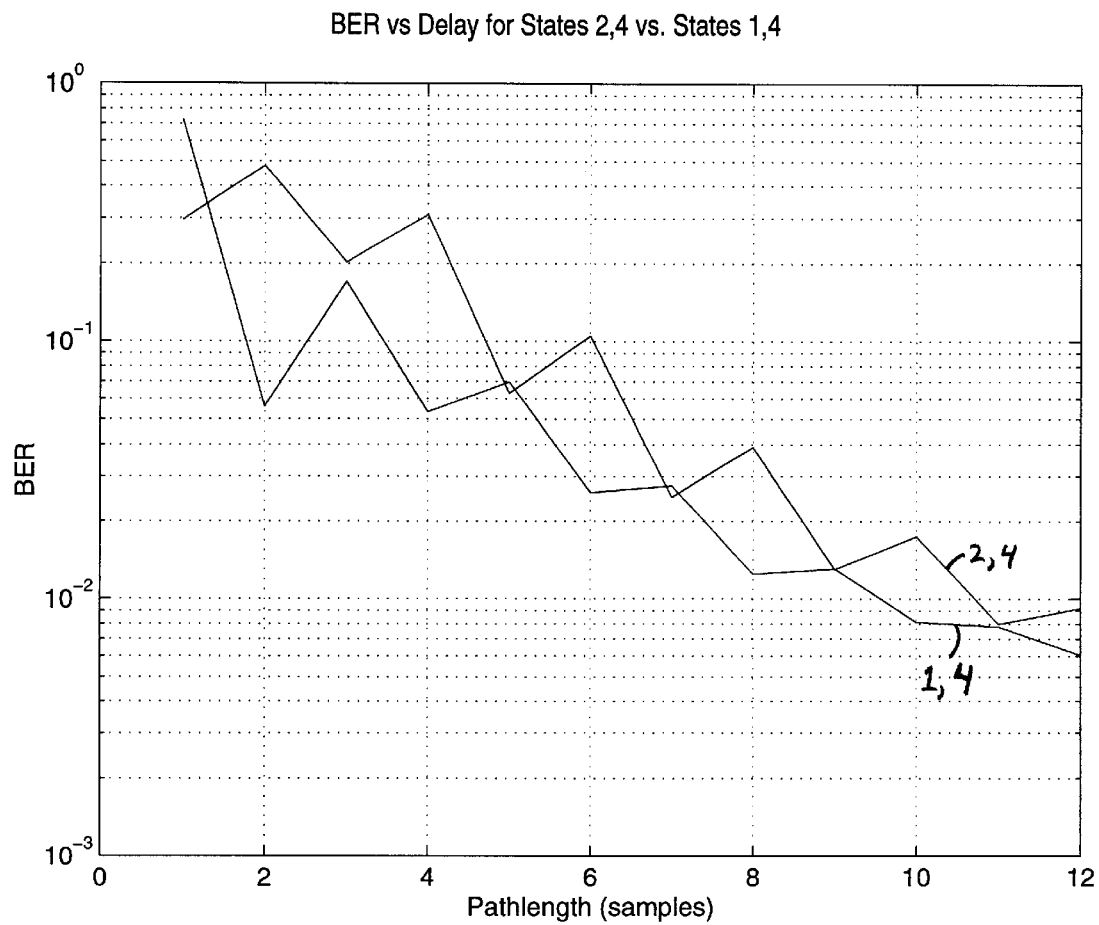
FIG. 9A is a graph contrasting the performance of generating estimated target sample values using early-decision when comparing the error metrics for states 2,4 vs 1,4 in the state transition diagram of FIG. 4.

It has been determined that the particular subset of states selected for the metric comparison significantly impacts the accuracy of the early-decision. For an EPR4 trellis sequence detector, for example, when comparing a subset of two states it has been determined that comparing the accumulated error metrics for states 2 and 3 or 1 and 4 (FIG. 4) provides the best performance. This is illustrated in FIG. 9A which shows the bit error rate (BER) of the early-decisions versus the location within the path memories the early-decision is taken when the accumulated error metrics is compared for states 2,4 vs 1,4 (of FIG. 4). Notice that in FIG. 9A the BER performance is better when comparing states 1,4 as opposed to when comparing states 2,4.

Figure 9B:
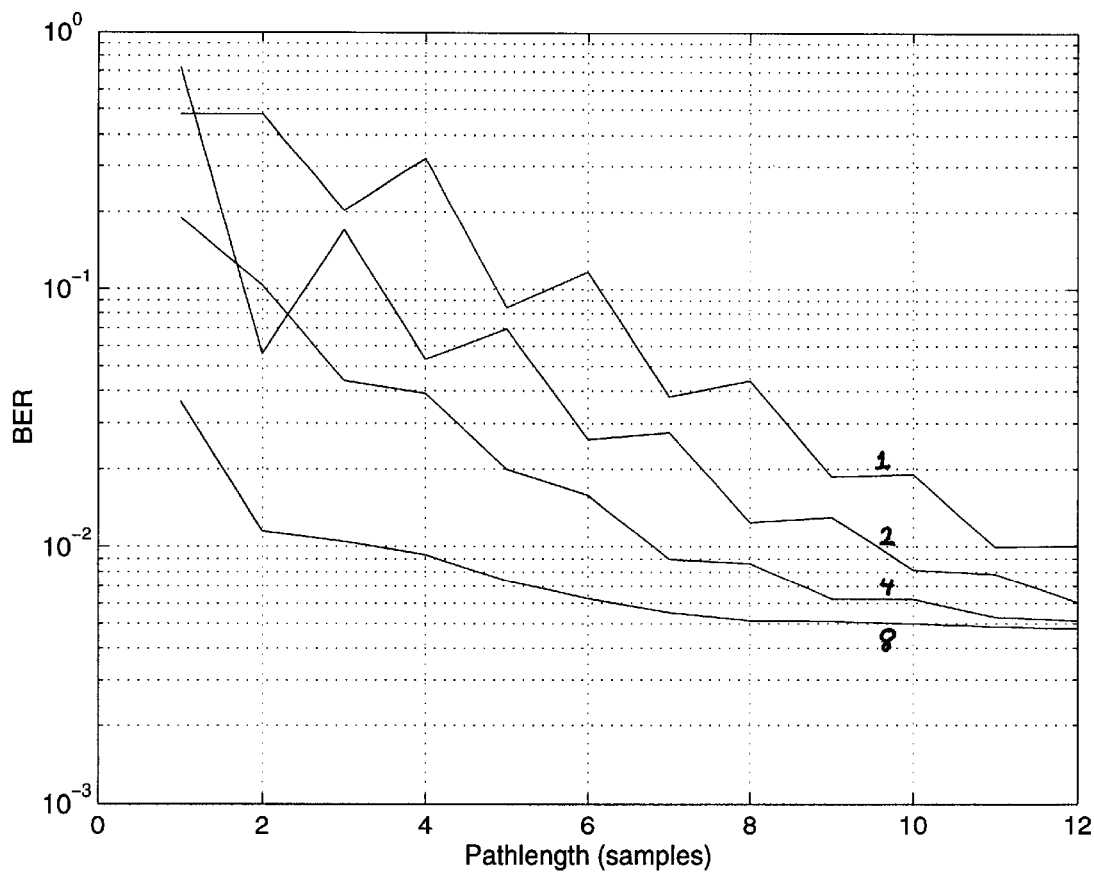
FIG. 9B is a graph contrasting the performance of generating estimated target sample values using early-decisions when comparing the error metrics of one state, two states, four states and eight states of the state transition diagram of FIG. 4.

Comparing the accumulated error metrics for only two states reduces the latency since it requires only one compare operation. A larger subset of states could be used (up to all eight states for the EPR4 state diagram of FIG. 4) which decreases the error rate as illustrated in FIG. 9B. However, evaluating more states also increases the latency (or circuit complexity) due to the increased number of comparisons. In FIG. 9B, when comparing four states of an EPR4 sequence detector the preferred states to compare are 1, 2, 3 and 4 (FIG. 4).

In FIG. 5A, the metric compare circuit 112 compares the accumulated error metrics of states 2 and 3 (FIG. 4) and selects the intermediate output of the corresponding path memory ($35_2$ or $3_{53}$) having the smaller error metric. The metric compare circuit 112 selects the intermediate output from the path memories ($35_2$ or $35_3$) over line 114 through multiplexer 116. In the embodiment shown in FIG. 5A, the NRZ bits stored in the path memories $35_2$ and $35_3$ are buffered by delay circuits 117A and 117B, respectively. The length of the delay (n in D") matches the delay required by the metric compare circuit 112 to compare the error metrics M1 and M2. In this manner, the NRZ bits that are selected through multiplexer 116 correspond directly to the error metrics being compared in the trellis at the time the error metrics were extracted. In an alternative embodiment, the NRZ bits are not buffered (delays 117A and 117B are removed) so that the NRZ bits selected through multiplexer 116 correspond to a location in the path memory delayed by the time required to perform the comparison. This latter embodiment may provide better performance; during the delay to perform the comparison, either of the path memories $35_2$ or $35_3$ may merge into the most likely sequence, or a sequence closer to the most likely sequence, thereby correcting the NRZ bit before selecting it through multiplexer 116.

In the preferred embodiment, the path memories $35_0$–$35_7$ are of length 32 and the early-decision output is taken from the 12th memory element. The location within the path memory determines the error rate and latency: taking the early-decision sooner decreases the latency but it also increases the error rate since there is a higher probability that the paths will not have merged into the most likely sequence for either state. The optimal location within the path memory to take the early-decision depends on the characteristics of the storage device, particularly the linear bit density employed. Preferably, the location is determined heuristically for a given storage device; the location of the early-decision is programmable and the optimal setting is determined by executing a calibration routine. The calibration steps include: selecting a particular location in the path memory; writing and reading a test pattern to/from the disc; accumulating an error measurement (e.g., bit error rate); repeating the steps with a different location; and ultimately selecting the location that generates the smallest error measurement.

Figure 5B:
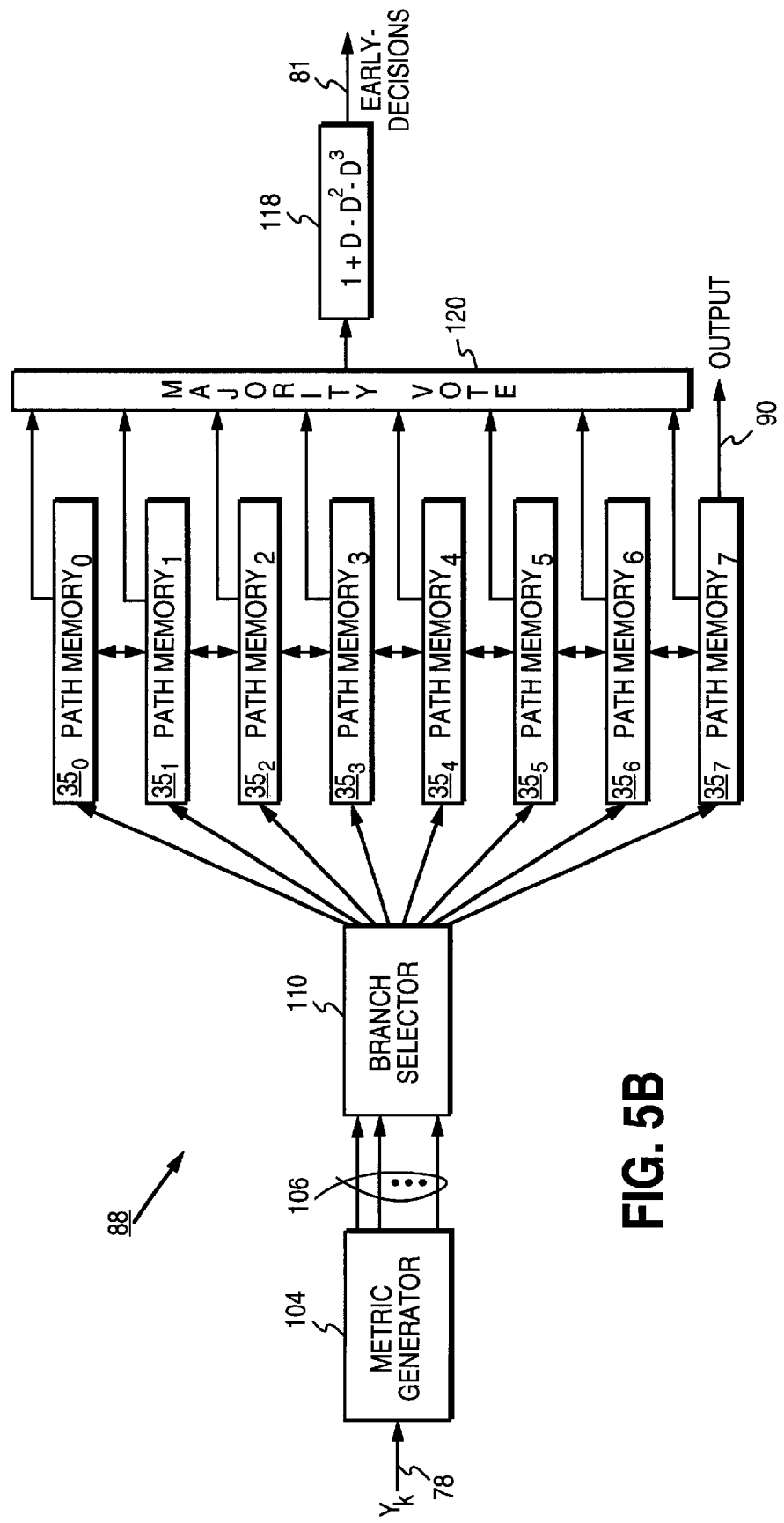
FIG. 5B shows an alternative embodiment of the EPR4 trellis sequence detector of FIG. 4, including a majority vote circuit for selecting the most likely early-decision for the estimated target sample.

An alternative embodiment for the trellis sequence detector of the present invention is shown in FIG. 5B. In this embodiment, rather than compare the accumulated error metrics for a subset of the states, a majority vote circuit 120 evaluates the NRZ bits stored in all of the path memories at the early-decision location and selects the binary value (0 or 1) of majority occurrence. This An embodiment provides an advantage in that the majority vote circuit 120 comprises simple one-bit comparators as opposed to the multi-bit comparators required for the metric comparator 112 of FIG. 5A. This embodiment also provides a different performance measurement: it assumes that the path memories will have merged into only a few sequences at the early-decision location, and the majority of paths which are the same will probably comprise the most likely sequence. Consequently, the majority vote embodiment may actually produce more accurate early-decisions over the metric compare embodiment of FIG. 5A, depending on the characteristics of the storage device.

The bits stored in the path memories of FIG. 5A and FIG. 5B are in the NRZ domain similar to the precoded sequence ~b(n) of FIG. 2. Therefore, the NRZ bits must be converted into the partial response signaling space so that an error value can be computed for the decision-directed feedback loops. The early-decision NRZ bits are converted into the EPR4 domain by passing the NRZ bits through a filter 118 of the form:

$$(1-D)(1+D)^2 = 1+D-D^2-D^3.$$

Figure 6:
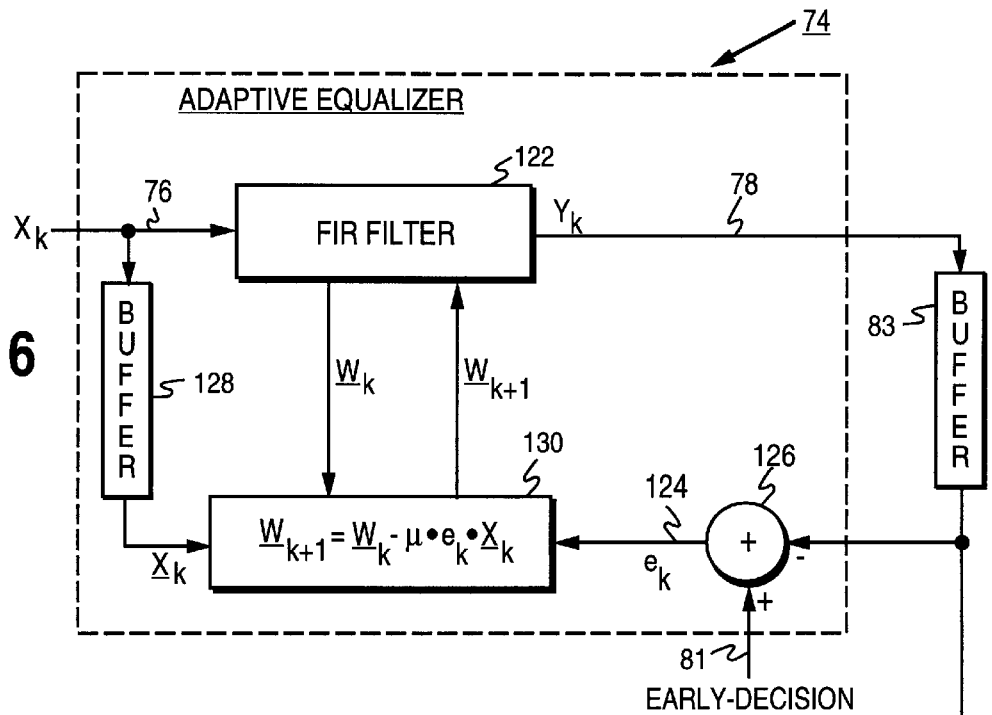
FIG. 6 shows details of an adaptive equalizer and how it uses the early-decisions to generate an error value for adjusting the filter coefficients.

Thus, the filter 118 outputs the early-decisions 81 in the EPR4 domain which are input into the gain control circuit 80, timing recovery circuit 68, and adaptive equalizer 74 of FIG. 2. Details of the adaptive equalizer 74 and its decision-directed feedback loop are shown in FIG. 6. The sample values 76 output by the A/D converter 64 of FIG. 2 are input into a finite impulse response (FIR) filter 122 which comprises a number of coefficients $W_k$. The frequency response of the FIR filter 122 is determined from the coefficients $W_k$ settings which are adjusted adaptively in order to adjust the spectrum of the output samples $Y_k$ 78 toward the desired partial response. In the preferred embodiment, the filter coefficients are adjusted using the well known least mean square (LMS) algorithm:

$$\underline{W}_{k+1} = \underline{W}_k - \mu \cdot e_k \underline{X}_k,$$

where $\underline{W}_k$ represents the vector of filter coefficients, $\mu$ is a programmable gain, $e_k$ represents a sample error between the filter's actual output and a desired output, and $\underline{X}_k$ represents a vector of sample values from the filter input. In other words, the LMS adaptive equalizer filter is a closed loop feedback system that attempts to minimize the mean squared error between an actual output of the filter and a desired output by continuously adjusting the filter's coefficients to achieve an optimum frequency response.

The sample error $e_k$ 124 is computed at the output of adder 126 by subtracting the buffered 83 equalized sample value $Y_k$ 78 from the early-decision estimated target value 81. As described above, the equalized samples 78 are buffered 83 to account for the latency in the path memory of the trellis sequence detector 88 in generating the early-decision 81. The read signal samples 76 at the input to the FIR filter 122 are also buffered 128 to account for this delay. A coefficient update circuit 130 uses the buffered read signal samples $\underline{X}_k$ 76, the current filter coefficients $\underline{W}_k$, and the sample gag error $e_k$ 124 to compute updated filter coefficients $\underline{W}_{k+1}$ according to the above described LMS algorithm. The updated coefficients $\underline{W}_{k+1}$ are then loaded into the FIR filter 122 for use in generating the next output sample value $Y_k$ 78.

Figure 7:
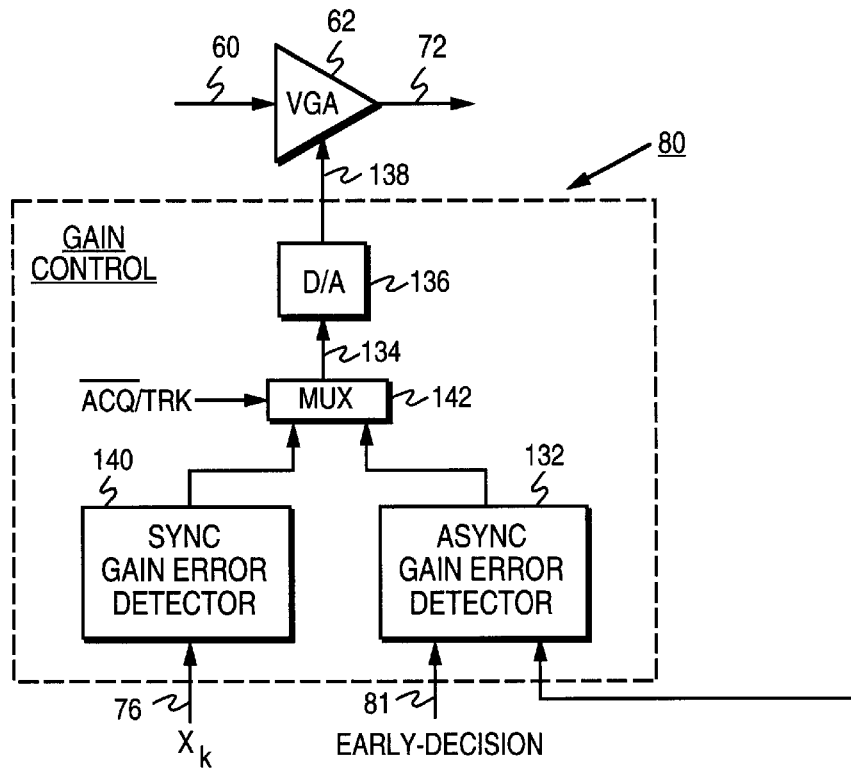
FIG. 7 shows details of a gain control circuit and how it uses the early-decisions to generate a gain error for adjusting the gain of the read signal through a VGA.

Details of the gain control circuit 80 and its decision-directed feedback loop are shown in FIG. 7, with further details disclosed in the above referenced patent application entitled "Asynchronous/Synchronous Gain Control for Interpolated Timing Recovery in a Sampled Amplitude Read Channel." During acquisition, an asynchronous gain error circuit 132 computes a gain error 134 from the read signal samples $X_k$ output by the A/D converter 64. During tracking, a synchronous gain error circuit 140 computes the gain error 134 from the early-decision estimated target values 81 and the buffered equalized sample values 78. The discrete-time gain error 134 is selected through a multiplexer 142 according to the mode of operation (acquisition/tracking) and converted into an analog control signal 138 by a digital-to-analog (D/A) converter 136. The analog control signal 138 adjusts the gain of the VGA 62 and thereby adjust the gain of the read signal 72 toward the magnitude of the desired partial response.

By computing the gain error 134 using an asynchronous gain error detector 140 during acquisition, the gain control loop is not affected by the delay in generating the estimated target samples from early-decisions 81 of the trellis sequence detector 88. Thus, the bandwidth of the gain loop can be increased during acquisition in order to decrease the acquisition time and the length of the acquisition preamble. During tracking, the bandwidth is decreased to attenuate the gain variance due to the random nature of the data; consequently, the delay associated with generating the estimated target samples using early-decisions 81 is not significant. There are two alternative embodiments for implementing the asynchronous gain error detector 132 of FIG. 7; in both embodiments, the read signal 66 is sampled asynchronous to the baud rate by fixing the sampling frequency 84 generated by the timing recovery circuit 68.

In a first embodiment, the asynchronous gain error detector 132 computes the gain error 134 by taking the discrete-time fourier transform (DTFT) of the asynchronous sample values 76 of the analog read signal. Preferably, the acquisition preamble 24 is a periodic pattern of bits which results in a substantially sinusoidal signal upon read back. If the acquisition preamble is a 2T pattern (i.e., a write current pattern a(n) 50 of +1, +1, −1, −1, +1, +1), then the read back signal is a sine wave with frequency $f_B/4$, where $f_B$ is the recording rate (baud rate). The magnitude of the DTFT at this frequency is defined for any four consecutive samples as:

$$\pi/2 \cdot ((X_0 - X_2)^2 + (X_1 - X_3)^2)^{1/2}$$

where $X_n$ are the discrete-time, asynchronous sample values of the analog read signal. To generate the gain error, it is not actually necessary to compute the square root or to multiply by $\pi/2$ in the above equation. Thus the discrete-time gain error can be computed simply as:

$$(X_0 - X_2)^2 + (X_1 - X_3)^2 - set\_point$$

where "set_point" is a constant representing the target gain for the read signal. The constant "set_point" can be selected slightly different than the optimum value for the desired partial response so as to attenuate any transient in switching between the asynchronous and synchronous modes of operation.

In the second embodiment of the present invention, the gain error 134 is computed from the asynchronous sample values 76 by subtracting a target set point from the average energy in the read signal. The average energy for a 2T acquisition preamble can be computed simply as:

$$X_0^2 + X_1^2$$

and the gain error computed as:

$$g_{error} = (X_0^2 - g) + (X_1^2 - g)$$

where $X_0$ and $X_1$ are asynchronous sample values 76 of the analog read signal and g is the target gain. Again, g can be selected slightly different than the optimum value for the desired partial response so as to attenuate any transient in switching between the asynchronous and synchronous modes of operation.

Once the nominal amplitude has been acquired and the read channel begins to track the user data, the bandwidth of the gain control circuit 80 is reduced to attenuate gain variance due to the randomness of the user data. The synchronous gain error detector 140 of FIG. 7 computes the gain error 134 during tracking from the synchronous, equalized sample values 78 output by the adaptive equalizer 74 (after buffering 83) and the early-decision estimated target samples 81 output by the trellis sequence detector 88. The tracking gain error equation is:

$$g_{error} = sgn(X_0) \, (X_0 - (\sim X_0 \cdot g_0/2)) + sgn(X_1) \, (X_1 - (\sim X_1 \cdot g_1/2))$$

where sgn(x) returns the sign of x and zero if x is zero; $X_0$ and $X_1$ are the synchronous, equalized samples 78 of the analog read signal; $\sim X_0$ and $\sim X_1$ are the early-decision estimated target samples 81 output by the trellis sequence detector 88; and $g_0$ and $g_1$ are the appropriate gain set points corresponding to $\sim X_0$ and $\sim X_1$.

Figure 8:
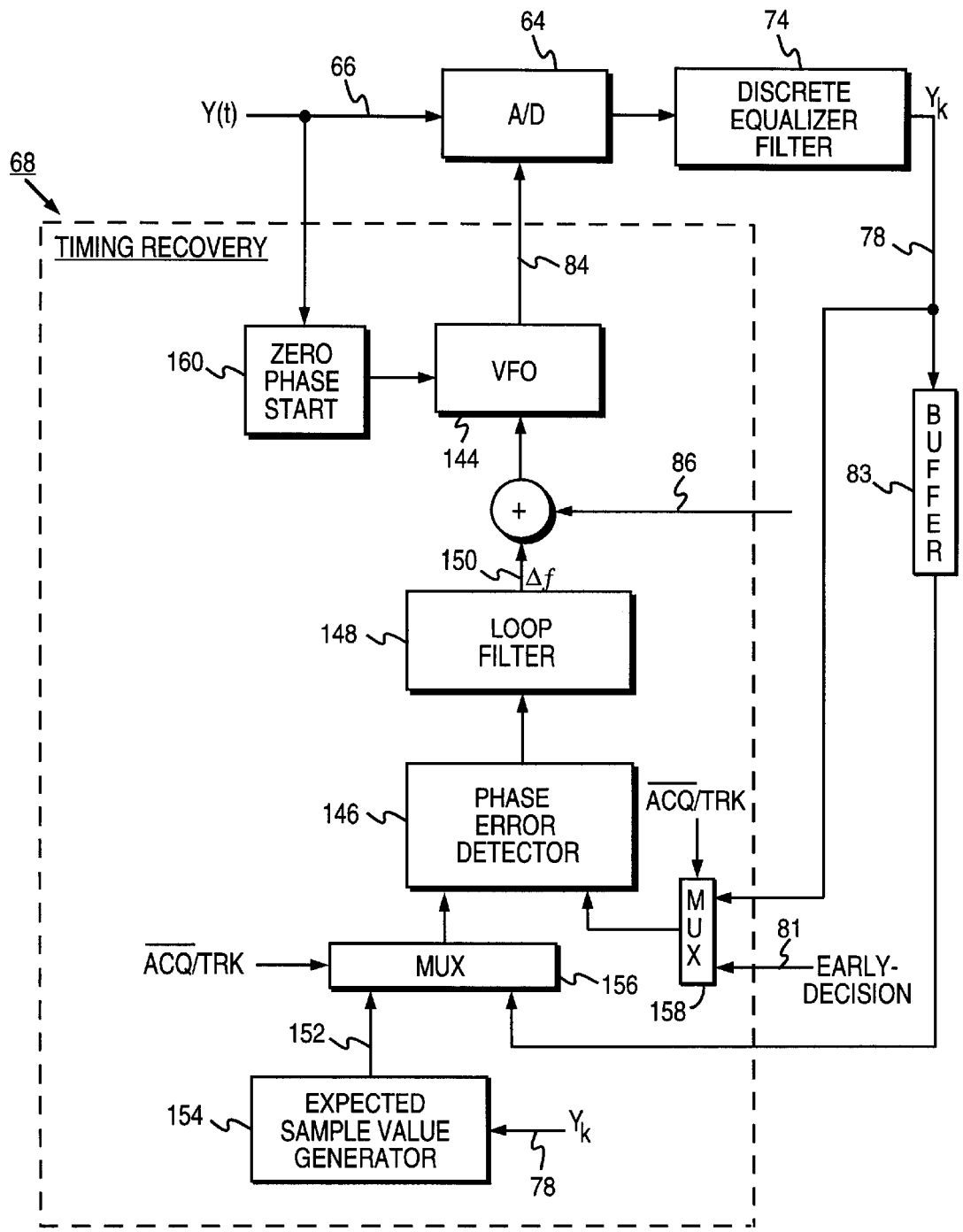
FIG. 8 shows details of a synchronous sampling timing recovery circuit and how it uses the early-decisions to generate a phase error for synchronizing the sampling rate of an A/D to the baud rate.

Details of the timing recovery circuit 68 and its decision-directed feedback loop are shown in FIG. 8. The output 84 of a variable frequency oscillator (VFO) 144 controls the sampling clock of a sampling device 64 which is typically an analog-to-digital (A/D) converter in digital read channels. A phase error detector 146 generates a phase error, and a loop filter 148 filters the phase error to generate a frequency offset $\Delta f$ 150 that settles to a value proportional to a frequency difference between the sampling clock 84 and the baud rate of the recorded data. The frequency offset $\Delta f$ 150, together with the center frequency control signal 86 from the frequency synthesizer 54 of FIG. 2, adjust the sampling clock 84 at the output of the VFO 144 in order to synchronize the sampling to the baud rate.

During acquisition, the phase error detector 146 generates the phase error from the unbuffered, equalized sample values 78 and expected sample values 152 generated by an expected sample value generator. The expected sample value generator 154 generates expected samples of the acquisition preamble 24 using a priori knowledge that the preamble comprises a known, periodic sequence (e.g., +2,0,−2,0,+2,0, . . . ). A state machine (e.g., a counter) is initialized using the unbuffered, equalized sample values 78, and then it cycles through a number of states to generate the expected samples of the preamble 24 independent of the read signal. This embodiment eliminates the errors that a conventional slicer can make, as well as avoiding the delay associated with computing the estimated target samples from the early-decisions 81 of the trellis sequence detector 88. For implementation details concerning the expected sample value generator 154, see the above referenced patent application entitled "A Synchronous Read Channel Employing an Expected Sample Value Generator for Acquiring a Preamble." Similar to the gain control loop, the bandwidth of the timing recovery loop can be increased during acquisition to decrease the acquisition time and the length of the acquisition preamble 24. During acquisition, the phase error $\Delta\Theta$ is computed according to the following equation:

$$\Delta\Theta = \sim X_0 \cdot X_1 \cdot 2 \text{ when } \sim X_1 = 0$$

where $\sim X_0$ and $\sim X_1$ are the expected sample values of the acquisition preamble 24 generated by the expected sample generator 154; and $X_1$ is the synchronous, equalized sample 78 of the analog read signal. During tracking, the bandwidth of the timing recovery loop is decreased to attenuate the phase variance due to the random nature of the data; consequently, the delay associated with generating the estimated target samples from the early-decisions 81 of the trellis sequence detector 88 is not significant. The phase error $\Delta\Theta$ is computed during tracking according to the following equation:

$$\Delta\Theta = (\sim X_0 - \sim X_2) \cdot X_1 + (X_2 - X_0) \cdot \sim X_1$$

where $\sim X_0$ and $\sim X_2$ are the early-decision estimated target samples 81 output by the trellis sequence detector 88; and $X_0$ and $X_1$ are the synchronous, equalized samples 78 of the analog read signal. The appropriate signals are selected through multiplexers 156 and 158 depending on the mode of operation (acquisition/tracking).

A zero phase start 160 circuit suspends operation of the VFO 144 at the beginning of acquisition in order to minimize the initial phase error between the sampling clock 84 and the read signal 66. This is achieved by disabling the VFO 144, detecting a zero crossing in the analog read signal 66, and re-enabling the VFO 144 after a predetermined delay between the detected zero crossing and the first baud rate sample.

The objects of the invention have been fully realized through the embodiments disclosed herein. Those skilled in the art will appreciate that the various aspects of the invention can be achieved through different embodiments without departing from the essential function. For example, the particular decision-directed feedback loops disclosed and the methods for generating the error values are not a limiting aspect of the present invention; there may be other methods for generating the gain error for gain control and the phase error for timing recovery. Furthermore, the synchronous sampling timing recovery PLL shown in FIG. 8 could be replaced with an interpolating timing recovery circuit without departing from the aspects of the present invention. The essential function of the present invention is to generate estimated target sample values for use in decision-directed feedback loops by extracting early-decisions from the path memory of a trellis sequence detector as opposed to using a simple slicer circuit that exhibits a much higher error rate. Therefore, the particular embodiments disclosed are illustrative and not meant to limit the scope of the invention as appropriately construed from the following claims.

What is claimed is:

1. A sampled amplitude read channel for reading data recorded on a disc storage medium by detecting an estimated sequence from discrete-time sample values generated by sampling pulses in an analog read signal from a read head positioned over the disc storage medium, comprising:
   (a) a sampling device for sampling the analog read signal to generate the discrete-time sample values;
   (b) a discrete-time trellis sequence detector operating according to a state transition diagram comprising a plurality of states, for detecting the estimated sequence from the discrete time sample values, the sequence detector comprising:
      (i) a metric generator for generating at least one accumulated error metric for each state in the state transition diagram relative to the discrete time sample value and a target sample value;
      (ii) at least one path memory corresponding to a path of a trellis diagram, wherein:
         the path memory stores a survivor sequence; and the path memory comprises a first memory element, a last memory element, and a plurality of intermediate memory elements;
      (iii) a metrics comparator for comparing at least two accumulated error metrics and fewer than all the states in the state transition diagram generated in response to the metric generator and outputting a compare signal and
      (iv) an early-decision output for outputting an early-decision estimated value generated in response to an intermediate memory element of the path memory.

2. The sampled amplitude read channel as recited in claim 1, further comprising a discrete-time timing recovery circuit for extracting timing information from the discrete-time sample values and the early-decision estimated value output by the discrete-time trellis sequence detector.

3. The sampled amplitude read channel as recited in claim 2, wherein the discrete-time fining recovery circuit comprises a phase error generator for generating a phase error in response to a sample value and the early-decision estimated value.

4. The sampled amplitude read channel as recited in claim 1, further comprising a discrete-time gain control circuit for extracting gain information from the discrete-time sample values and the early-decision estimated value output by the discrete-time trellis sequence detector.

5. The sampled amplitude read channel as recited in claim 4, wherein the discrete-time gain control circuit comprises a gain error generator for generating a gain error in response to a sample value and the early-decision estimated value.

6. The sampled amplitude read channel as recited in claim 1, wherein:
   (a) the state transition diagram is:

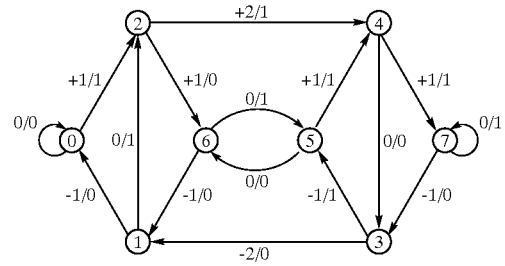

and
   (b) the metrics comparator compares the accumulated error metrics generated for states 2 and 3.

7. The sampled amplitude read channel as recited in claim 1, wherein:
   (a) the state transition diagram is:

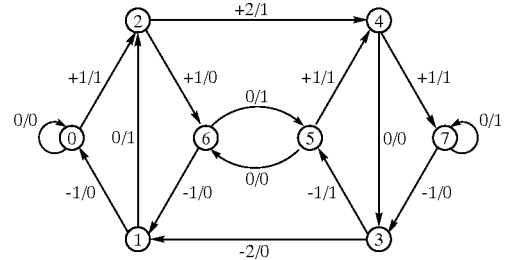

and
   (b) the metrics comparator compares the accumulated error metrics generated for states 1 and 4.

8. The sampled amplitude read channel as recited in claim 1, further comprising a converter for converting the early-decision estimated value from a first domain into a second domain.

9. The sampled amplitude read channel as recited in claim 1, further comprising a discrete-time equalizer, responsive to the early-decision estimated value, for equalizing the discrete-time sample values according to a desired partial response and generating equalized sampled values.

10. The sampled amplitude read channel as recited in claim 9, further comprising a samples buffer for buffering the equalized sample values, wherein the discrete-time equalizer uses the equalized sample values output by the samples buffer to equalize the discrete-time sample values according to the desired partial response.

11. The sampled amplitude read channel as recited in claim 9, wherein the discrete-time equalizer comprises:
   (a) an error value generator for generating an error value in response to an equalized sample value and the early-decision estimated value;
   (b) a plurality of coefficients; and
   (c) a coefficient update circuit for adaptively adjusting the coefficients using the error value.

12. The sampled amplitude read channel as recited in claim 9, further comprising a samples buffer for buffering the discrete-time sample values, wherein the discrete-time timing recovery circuit uses the discrete-time sample values output by the samples buffer to extract the timing information.

13. A sampled amplitude read channel for reading data recorded on a disc storage medium by detecting an estimated sequence from discrete-time sample values generated by sampling pulses in an analog read signal from a read head positioned over the disc storage medium, comprising:
   (a) a sampling device for sampling the analog read signal to generate the discrete-time sample values;
   (b) a discrete-time trellis sequence detector for detecting the estimated sequence from the discrete time sample values, the sequence detector comprising:
      (i) a metric generator for generating an error metric relative to the discrete-time time sample value and a target sample value;
      (ii) at least one path memory corresponding to a path of a trellis diagram, wherein:
         the path memory stores a survivor sequence; and the path memory comprises a first memory element, a last memory element, and a plurality of intermediate memory elements;
      (iii) a majority vote circuit for comparing the estimated values stored in a plurality of path memories at a predetermined intermediate memory element and outputting a compare signal; and
      (iv) an early-decision output for outputting an early-decision estimated value generated in response to the cmopare signal of the majority vote circuit.

14. The sampled amplitude read channel as recited in claim 13, further comprising a converter for converting the early-decision estimated value from a first domain into a second domain.

15. The sampled amplitude read channel as recited in claim 13, further comprising a discrete-time equalizer, responsive to the early-decision estimated value, for equalizing the discrete-time sample values according to a desired partial response and generating equalized sampled values.

16. The sampled amplitude read channel as recited in claim 15, wherein the discrete-time equalizer comprises:
   (a) an error value generator for generating an error value in response to an equalized sample value and the early-decision estimated value;
   (b) a plurality of coefficients; and
   (c) a coefficient update circuit for adaptively adjusting the coefficients using the error value.

17. The sampled amplitude read channel as recited in claim 13, further comprising a discrete-time gain control circuit for extracting gain information from the discrete-time sample values and the early-decision estimated value output by the discrete-time trellis sequence detector.

18. The sampled amplitude read channel as recited in claim 17, wherein the discrete-time gain control circuit comprises a gain error generator for generating a gain error in response to the discrete-time sample values and the early-decision estimated value.

19. The sampled amplitude read channel as recited in claim 13, further comprising a discrete-time timing recovery circuit for extracting timing information from the discrete-time sample values and the early-decision estimated value output by the discrete-time trellis sequence detector.

20. The sampled amplitude read channel as recited in claim 19, wherein the discrete-time tiling recovery circuit comprises a phase error generator for generating a phase error in response to the discrete-time sample values and the early-decision estimated value.

* * * * *